(12) United States Patent
Fuller et al.

(10) Patent No.: US 7,305,509 B2
(45) Date of Patent: Dec. 4, 2007

(54) METHOD AND APPARATUS FOR ZERO STUB SERIAL TERMINATION CAPACITOR OF RESISTOR MOUNTING OPTION IN AN INFORMATION HANDLING SYSTEM

(75) Inventors: Paul Fuller, Austin, TX (US); Jason M. Lau, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 233 days.

(21) Appl. No.: 10/383,795

(22) Filed: Mar. 7, 2003

(65) Prior Publication Data

US 2004/0196062 A1 Oct. 7, 2004

(51) Int. Cl.
G06F 13/14 (2006.01)
H03K 19/003 (2006.01)
H05K 7/00 (2006.01)
H05K 1/16 (2006.01)

(52) U.S. Cl. .................. 710/305; 326/30; 361/783; 361/777; 361/748; 174/260; 174/261

(58) Field of Classification Search ............... 710/305; 326/30; 439/43, 55; 174/261, 260; 361/783, 361/777, 748; 257/786; 716/4
See application file for complete search history.

(56) References Cited

U.S. PATENT DOCUMENTS

| | | | |
|---|---|---|---|
| 5,237,131 A * | 8/1993 | Catlin | 174/261 |
| 5,266,747 A * | 11/1993 | Gheorghiu et al. | 174/254 |
| 5,805,428 A * | 9/1998 | Singer | 361/777 |
| 5,896,508 A | 4/1999 | Lee | |
| 5,994,766 A * | 11/1999 | Shenoy et al. | 257/659 |
| 6,169,253 B1 * | 1/2001 | Jairazbhoy et al. | 174/250 |
| 6,194,979 B1 * | 2/2001 | Bloom et al. | 333/22 R |
| 6,232,792 B1 * | 5/2001 | Starr | 326/30 |
| 6,272,278 B1 | 8/2001 | Takahata et al. | |
| 6,274,824 B1 * | 8/2001 | Rueda-Aguilocho et al. | 174/261 |
| 6,381,269 B1 | 4/2002 | Gradl et al. | |
| 6,384,346 B1 * | 5/2002 | Chang et al. | 174/261 |
| 6,404,660 B1 * | 6/2002 | Gamini et al. | 365/51 |
| 6,456,502 B1 * | 9/2002 | Miller et al. | 361/760 |
| 6,457,367 B1 | 10/2002 | Behm et al. | |
| 6,606,732 B2 * | 8/2003 | Buffet et al. | 716/4 |
| 6,815,890 B2 * | 11/2004 | Tsai et al. | 313/584 |
| 6,901,503 B2 * | 5/2005 | Barlow et al. | 712/210 |
| 6,921,979 B2 * | 7/2005 | Downey et al. | 257/773 |
| 6,985,365 B2 * | 1/2006 | Krontz et al. | 361/777 |
| 2002/0030530 A1 * | 3/2002 | Tsutsumi | 327/365 |

* cited by examiner

*Primary Examiner*—Christopher E. Lee
*Assistant Examiner*—Christopher Daley
(74) *Attorney, Agent, or Firm*—Haynes and Boone, LLP

(57) ABSTRACT

A method of implementing zero stub serial termination component mounting in an information handling system includes providing a first and second serial terminator option. The first serial terminator option includes a first pad and a second pad on a circuit board. The second serial terminator option is perpendicular to the first serial terminator option on the circuit board. The second serial terminator option includes a third pad and shares the second pad with the first serial terminator option on the circuit board. One of the first serial terminator option and second serial terminator option are adapted for receiving a component coupled across the pads of the respective serial terminator without leaving a stub which adversely impacts a signal integrity of a signal traversing the respective serial terminator.

21 Claims, 3 Drawing Sheets

METHOD AND APPARATUS FOR ZERO STUB SERIAL TERMINATION CAPACITOR OF RESISTOR MOUNTING OPTION IN AN INFORMATION HANDLING SYSTEM

BACKGROUND

The present disclosure relates generally to information handling systems, and more particularly to a method and apparatus for zero stub serial termination capacitor or resistor mounting option in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In conjunction with circuit board design for information handling systems, a series termination mount option provides a very helpful tool. However, the series termination mount option can cause serious problems with signals due to necessary stubs on a respective transmission line. In particular, the stubs cause reflections and, furthermore, can cause unwanted switching of signals.

FIG. 1 illustrates a plan view layout of a capacitor or resistor termination mounting option for a conventional circuit board 10. Each mounting option (TX+ and TX−) uses two terminators (12,14), (16,18) in parallel for the respective mount option as shown in FIG. 1. A capacitor or resistor (not shown) is mounted between pads 20 of a corresponding terminator of a desired mount option. Each terminator is defined by two pads 20, each pad surrounded by a place bound 22. The place bound defines an area where no part is to occur on the circuit board. Companies have used mounting options and termination for years. A problem with such a mount option is that a component gets mounted onto the desired termination, leaving one of the two signals with a stub 24.

Accordingly, a method to eliminate the stubs while keeping the mount option, as well as using less space, is needed. It would be desirable to provide a zero stub serial termination mounting option absent the disadvantages found in the prior methods discussed above.

SUMMARY

According to one embodiment, a method of implementing zero stub serial termination component mounting in an information handling system includes providing a first and second serial terminator option. The first serial terminator option includes a first pad and a second pad on a circuit board. The second serial terminator option is perpendicular to the first serial terminator option on the circuit board. The second serial terminator option includes a third pad and shares the second pad with the first serial terminator option on the circuit board. One of the first serial terminator option and second serial terminator option are adapted for receiving a component coupled across the pads of the respective serial terminator without leaving a stub which adversely impacts a signal integrity of a signal traversing the respective serial terminator. An information handling system is also disclosed.

DETAILED DESCRIPTION

According to one embodiment of the present disclosure, a method and system apparatus are disclosed for a zero stub serial termination capacitor or resistor mounting option in an information handling system. The method and system can be better understood by reference to the flow charts, drawing figures, and additional discussion included herein.

Figure 2:
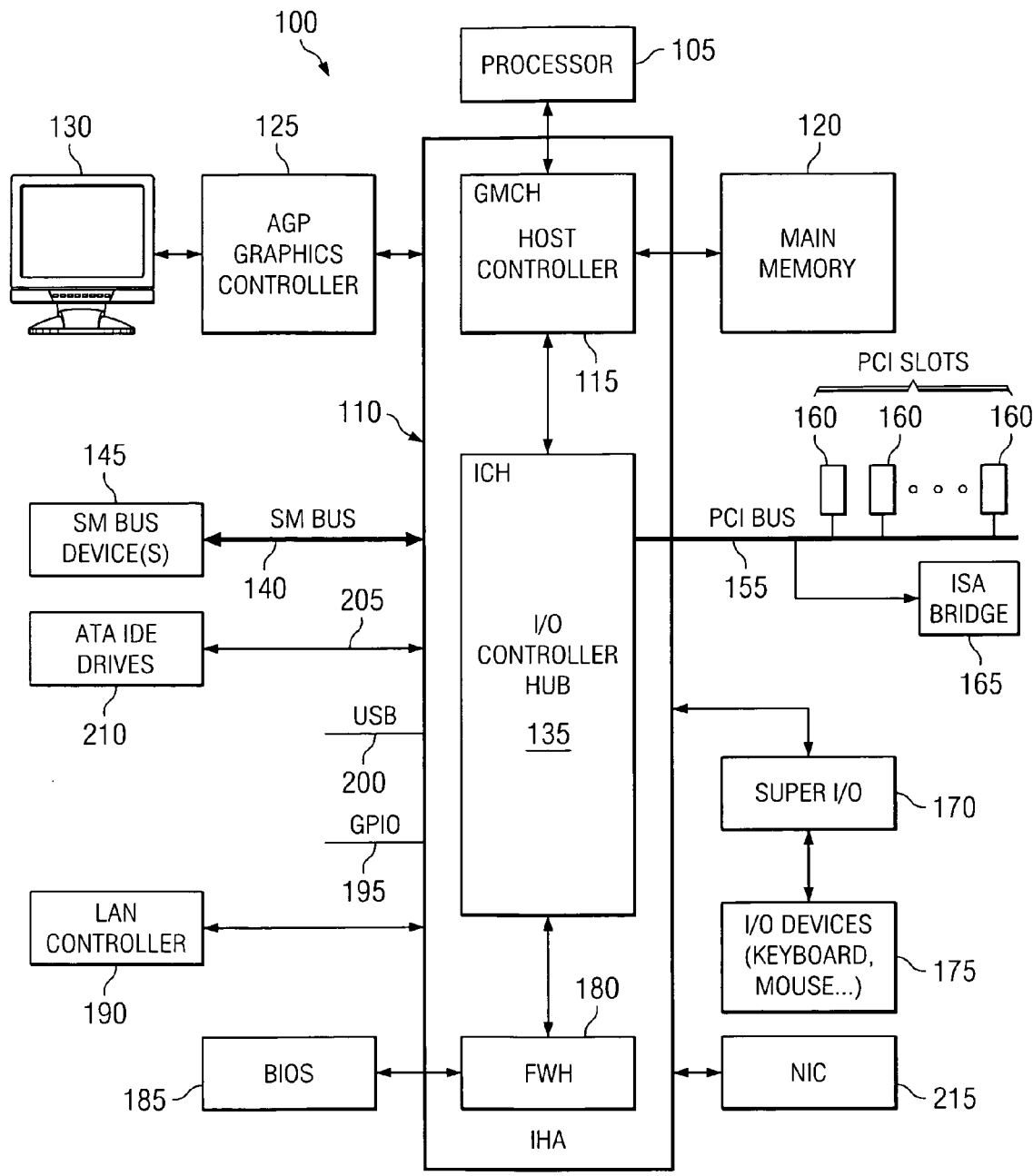
FIG. 2 illustrates a block diagram view of an information handling system featuring a zero stub serial termination component mounting option according to an embodiment of the present disclosure.

FIG. 2 depicts a high level block diagram of an information handling system 100 in which the disclosed technology is practiced. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

The particular information handling system 100 depicted in FIG. 2 is a portable computer which includes a processor 105. An Intel Hub Architecture (IHA) chip 110 provides system 100 with memory and I/O functions. More particularly, IHA chip 110 includes a Graphics and AGP Memory Controller Hub (GMCH) 115. GMCH 115 acts as a host controller that communicates with processor 105 and further acts as a controller for main memory 120. GMCH 115 also provides an interface to Advanced Graphics Port (AGP) controller 125 which is coupled thereto. A display 130 is coupled to AGP controller 125. IHA chip 110 further includes an I/O Controller Hub (ICH) 135 which performs numerous I/O functions. ICH 135 is coupled to a System Management Bus (SM Bus) 140 which is coupled to one or more SM Bus devices 145.

ICH 135 is coupled to a Peripheral Component Interconnect (PCI) bus 155 which is coupled to mini PCI connector slots 160 which provide expansion capability to portable computer 100. A super I/O controller 170 is coupled to ICH 135 to provide connectivity to input devices such as a keyboard and mouse 175 as shown in FIG. 2. A firmware hub (FWH) 180 is coupled to ICH 135 to provide an interface to system BIOS 185 which is coupled to FWH 180. A General Purpose I/O (GPIO) bus 195 is coupled to ICH 135. USB ports 200 are coupled to ICH 135 as shown. USB devices such as printers, scanners, joysticks, etc. can be added to the system configuration on this bus. An integrated drive electronics (IDE) bus 205 is coupled to ICH 135 to connect IDE drives 210 to the computer system. System 100 may further include a network interface card (NIC) 215.

Figure 3:
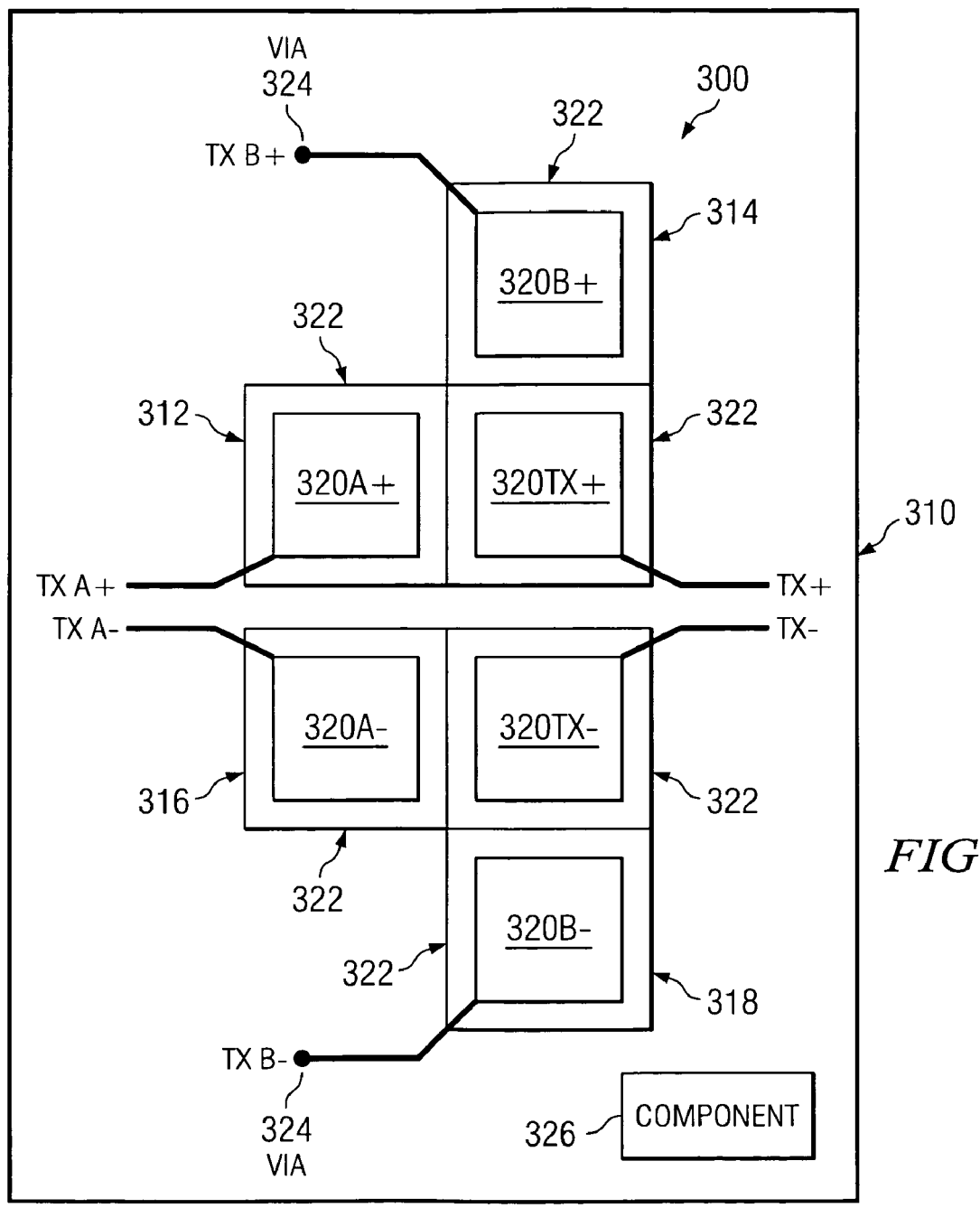
FIG. 3 illustrates a plan view layout of a zero stub serial termination component mounting option for a circuit board in an information handling system according to an embodiment of the present disclosure.

FIG. 3 illustrates a plan view layout of a zero stub serial termination component mounting option 300 for a circuit board 310 in an information handling system 100 (FIG. 2) according to an embodiment of the present disclosure. Each mounting option (TX+ and TX−) for a differential pair of signals (+,−) uses two terminators (312,314), (316,318) configured perpendicular to one another as shown in FIG. 3. A capacitor or resistor component 326 can be mounted between pads 320 of a corresponding terminator of a desired mount option. In addition, spacing between terminators is minimized or maintained within a close proximity of one another.

For example, terminator 312 includes pad 320 A+ and pad 320 TX+. Terminator 314 includes pad 320 B+ and pad 320 TX+. Accordingly, terminators (312,314) for the serial termination component mounting option TX+ are defined in part by separate pads 320 A+, 320 B+, respectively, and a common pad 320 TX+. In a similar manner, terminators (316,318) for the serial termination component mounting option TX− are defined in part by separate pads 320 A−, 320 B−, respectively, and a common pad 320 TX−. Each pad is surrounded by a place bound 322, wherein the place bound defines an area where no part is to occur on the circuit board. In addition, each pad includes a conductive material, such as metal. Fabrication of the circuit board according to the embodiments as described herein can be accomplished using fabrication techniques known in the art.

In one embodiment, circuit board 310 includes a multi-layer or multilevel printed circuit board. Accordingly, vias 324 are provided on terminals TX B+ and TX B−, for routing a corresponding signal line to a different layer of the circuit board 310.

Figure 1:
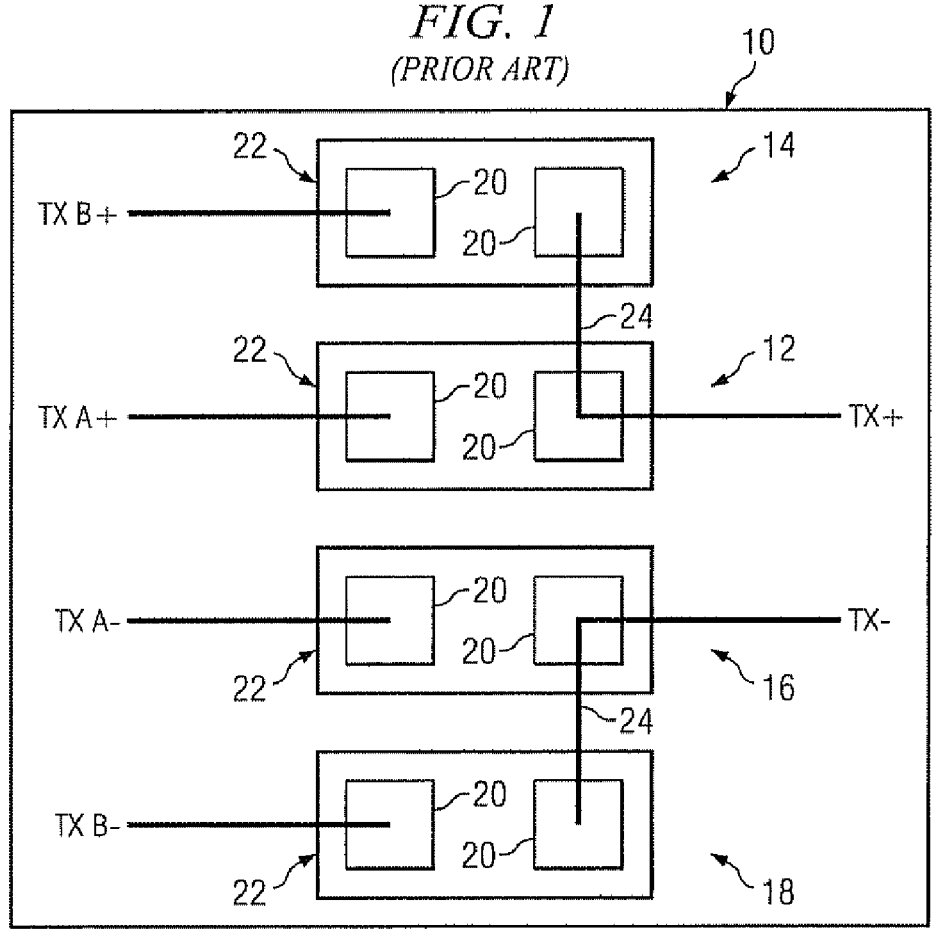
FIG. 1 illustrates a plan view layout of a capacitor or resistor termination mounting option for a conventional circuit board.

Accordingly, instead of using two terminators in parallel for a mount option as shown in FIG. 1, the zero stub serial termination component mounting option 300 of the present disclosure places terminators 312 and 314 perpendicular to each other, while overlapping one of the two pads, shown in FIG. 3 as 320 TX+. The overlap pad 320 TX+ advantageously eliminates the stub, and furthermore, consumes less printed circuit board (PCB) area than the prior configuration.

Figure 4:
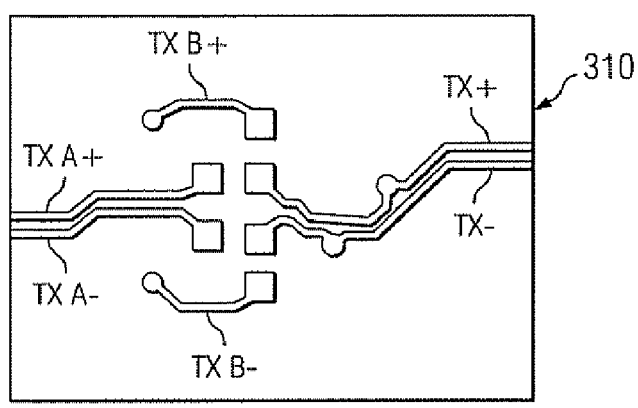
FIG. 4 shows an alternate plan view of the circuit board having the zero stub serial termination mounting option of FIG. 3.

FIG. 4 shows an alternate plan view of the circuit board having the zero stub serial termination mounting option of FIG. 3.

The zero stub serial termination component mounting option according to the embodiments of the present disclosure is valuable as long as there are high speed signals that need series termination. Instead of having a damaging stub on a critical signal of a circuit board, the embodiments of the present disclosure provide a novel method for connecting the signals. In particular, the perpendicular (90 degree) overlapping region of the terminators for a respective mount option saves space on the PCB, as well as, maintaining an original signal passing through the terminator intact. In other words, the embodiments of the present disclosure assist in maintaining a signal integrity, and minimize a signal degradation resulting from large distances of signal line spacing.

Furthermore, regardless of which set of terminators are chosen for a given mount option, there is no stub (i.e., zero stub). That is, the mount options of the embodiments of the present disclosure have no damaging stub. With devices becoming smaller and using higher signal frequencies (for example, greater than 1 GHz), the zero stub serial termination component mounting option of the present disclosure provides the needed improvement as discussed herein.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A differential signal routing method for a circuit board, the method comprising:

routing a first differential trace pair to a corresponding first pad pair;

routing a second differential trace pair to a corresponding second pad pair, wherein an alignment between the first and second pad pairs is symmetrical with respect to the two differential sides of a configuration, and wherein a spacing between the pads of the first and second pad pairs is adapted to receive a pair of components to couple the first differential trace pair to the second differential trace pair; and routing a third differential trace pair to a corresponding third pad pair, wherein the alignment between the first and third pad pairs is symmetrical with respect to the two differential sides of the configuration, and wherein the spacing between the pads of the first and third pad pairs is adapted to receive a pair of components to couple the first differential trace pair to the third differential trace pair.

2. The differential signal routing method of claim 1, further comprising attaching, between each pad of the first pad pair and its corresponding pad of the second pad pair, a corresponding component from a component pair, thereby electrically coupling the first differential trace pair to the second differential trace pair.

3. The differential signal routing method of claim 2, wherein the components are each selected from the group of component types consisting of a capacitor and a resistor.

4. The differential signal routing method of claim 1, further comprising attaching, between each pad of the first pad pair and its corresponding pad of the third pad pair, a corresponding component from a component pair, thereby electrically coupling the first differential trace pair to the third differential trace pair.

5. The differential signal routing method of claim 1, further comprising interfacing the first differential trace pair to an output port, and interfacing the second and third differential trace pairs, respectively, to two different input ports.

6. The differential signal routing method of claim 5, further comprising routing at least one of the second and third differential trace pairs as substantially equal length traces to vias that couple a differential signal to another layer of the multilevel printed circuit board.

7. The differential signal routing method of claim 1, wherein the circuit board comprises a multilevel printed circuit board.

8. The differential signal routing method of claim 1, wherein the alignment between the first and second pad pairs is substantially perpendicular to the alignment between the first and third pad pairs.

9. The information handling system of claim 8, further comprising a component pair, each component of the pair electrically coupling a respective pad of the first pad pair to its corresponding pad of the second pad pair.

10. The information handling system of claim 8, wherein the first differential trace pair is interfaced to an output port, and the second and third differential trace pairs are interfaced, respectively, to two different input ports.

11. The information handling system of claim 10, wherein at least one of the second and third differential trace pairs comprise substantially equal length traces to vias that couple a differential signal to another layer of the multilevel printed circuit board.

12. The information handling system of claim 8, wherein the circuit board comprises a multilevel printed circuit board.

13. The information handling system of claim 8, wherein the alignment between the first and second pad pairs is substantially perpendicular to the alignment between the first and third pad pairs.

14. The printed circuit board of claim 13, further comprising a component pair, each component of the pair electrically coupling a respective pad of the first pad pair to its corresponding pad of the second pad pair.

15. The printed circuit board of claim 13, wherein the first differential trace pair is interfaced to an output port, and the second and third differential trace pairs are interfaced, respectively, to two different input ports.

16. The printed circuit board of claim 15, wherein at least one of the second and third differential trace pairs comprise substantially equal length traces to vias that couple a differential signal to another layer of the multilevel printed circuit board.

17. The printed circuit board of claim 13, wherein the circuit board comprises a multilevel printed circuit board.

18. An information handling system comprising a printed circuit board having:
 a first differential trace pair terminating at a corresponding first pad pair;
 a second differential trace pair terminating at a corresponding second pad pair, wherein an alignment between the first and second pad pairs is symmetrical with respect to the two differential sides of a configuration, and wherein a spacing between the pads of the first and second pad pairs is adapted to receive a pair of components to couple the first differential trace pair to the second differential trace pair; and
 a third differential trace pair terminating at a corresponding third pad pair, wherein the alignment between the first and third pad pairs is symmetrical with respect to the two differential sides of the configuration, and wherein the spacing between the pads of the first and third pad pairs is adapted to receive a pair of components to couple the first differential trace pair to the third differential trace pair.

19. The information handling system of claim 18, wherein each component is selected from the group of component types consisting of a capacitor and a resistor.

20. A printed circuit board having:
 a first differential trace pair terminating at a corresponding first pad pair;
 a second differential trace pair terminating at a corresponding second pad pair, wherein an alignment between the first and second pad pairs is symmetrical with respect to the two differential sides of a configuration, and wherein a spacing between the pads of the first and second pad pairs is adapted to receive a pair of components to couple the first differential trace pair to the second differential trace pair; and
 a third differential trace pair terminating at a corresponding third pad pair, wherein the alignment between the first and third pad pairs is symmetrical with respect to the two differential sides of the configuration, and wherein the spacing between the pads of the first and third pad pairs is adapted to receive a pair of components to couple the first differential trace pair to the third differential trace pair.

21. The printed circuit board of claim 20, wherein each component is selected from the group of component types consisting of a capacitor and a resistor.

* * * * *